United States Patent
Ahn et al.

(10) Patent No.: US 6,570,248 B1
(45) Date of Patent: May 27, 2003

(54) STRUCTURE AND METHOD FOR A HIGH-PERFORMANCE ELECTRONIC PACKAGING ASSEMBLY

(75) Inventors: Kie Y. Ahn, Chappaqua, NY (US); Leonard Forbes, Corvallis, OR (US); Eugene H. Cloud, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/924,303

(22) Filed: Aug. 8, 2001

Related U.S. Application Data (62) Division of application No. 09/144,290, filed on Aug. 31, 1998, now Pat. No. 6,281,042.

(51) Int. Cl.⁷ .............................................. H01L 23/34
(52) U.S. Cl. ...................................... 257/724; 257/723
(58) Field of Search ................................. 257/723, 724

(56) References Cited

U.S. PATENT DOCUMENTS

| | | | |
|---|---|---|---|
| 3,923,567 A | 12/1975 | Lawrence | 156/7 |
| 3,959,047 A | 5/1976 | Alberts et al. | 156/8 |
| 3,982,268 A | 9/1976 | Anthony et al. | 357/55 |
| 4,081,701 A | 3/1978 | White, Jr. et al. | 307/355 |
| 4,394,712 A | 7/1983 | Anthony | 361/411 |
| 4,595,428 A | 6/1986 | Anthony et al. | 148/187 |
| 4,601,021 A * | 7/1986 | Paul et al. | 345/501 |
| 4,631,636 A | 12/1986 | Andrews | 361/385 |
| 4,653,025 A | 3/1987 | Minato et al. | 365/154 |
| 4,710,798 A * | 12/1987 | Marcantonio | 257/777 |
| 4,713,841 A | 12/1987 | Porter et al. | 455/608 |
| 4,739,446 A | 4/1988 | Landis | 361/385 |
| 4,870,470 A | 9/1989 | Bass, Jr. et al. | 357/23.5 |
| 4,977,439 A | 12/1990 | Esquivel et al. | 357/49 |
| 5,061,987 A | 10/1991 | Hsia | 357/71 |
| 5,073,771 A * | 12/1991 | Satta et al. | 345/163 |
| 5,079,618 A | 1/1992 | Farnworth | 357/81 |
| 5,153,814 A | 10/1992 | Wessely | 361/382 |
| 5,168,334 A * | 12/1992 | Mitchell et al. | 257/324 |

(List continued on next page.)

FOREIGN PATENT DOCUMENTS

| | | | |
|---|---|---|---|
| JP | 4-133472 | 5/1992 | |
| WO | 94/05039 | 3/1994 | H01L/23/48 |

OTHER PUBLICATIONS

Beddingfield, C., et al., "Flip Chip Assembly of Motorola Fast Static RAM Known Good Die", *1997 Proceedings, 47th Electronic Components and Technology Conference*, San Jose, CA, 643–648, (May 18–21, 1997).

Blalock, T.N., et al., "A High–Speed Clamped Bit–Line Current–Mode Sense Amplifier", *IEEE Journal of Solid–State Circuits, 26*(4), 542–548, (Apr. 1991).

Cao, L., et al., "A Novel "Double–Decker" Flip–Chip/BGA Package for Low Power Giga–Hertz Clock Distribution", *1997 Proceedings, 47th Electronic Components and Technology Conference*, San Jose, CA, 1152–1157, (May 18–21, 1997).

(List continued on next page.)

*Primary Examiner*—Amir Zarabian
*Assistant Examiner*—Jeff Vockrodt
(74) *Attorney, Agent, or Firm*—Schwegman, Lundberg, Woessner & Kluth, P.A.

(57) ABSTRACT

An improved structure and method are provided for increasing the operational bandwidth between different circuit devices, e.g. logic and memory chips, without requiring changes in current CMOS processing techniques. The structure includes the use of a silicon interposer. The silicon interposer can consist of recycled rejected wafers from the front-end semiconductor processing. Micro-machined vias are formed through the silicon interposer. The micro-machined vias include electrical contacts which couple various intergrated circuit devices located on the opposing surfaces of the silicon interposer.

39 Claims, 3 Drawing Sheets

U.S. PATENT DOCUMENTS

| | | | |
|---|---|---|---|
| 5,229,327 A | | 7/1993 | Farnworth .................. 437/209 |
| 5,258,648 A | * | 11/1993 | Lin ............................. 257/747 |
| 5,258,658 A | | 11/1993 | Morikawa ................... 257/778 |
| 5,275,001 A | | 1/1994 | Yokotani et al. .............. 62/3.7 |
| 5,313,361 A | | 5/1994 | Martin ....................... 361/699 |
| 5,317,197 A | | 5/1994 | Roberts ..................... 257/401 |
| 5,343,366 A | | 8/1994 | Cipolla et al. .............. 361/785 |
| 5,352,998 A | | 10/1994 | Tamino ...................... 333/247 |
| 5,362,976 A | | 11/1994 | Suzuki ........................ 257/81 |
| 5,391,917 A | * | 2/1995 | Gilmour et al. ............ 257/690 |
| 5,392,407 A | | 2/1995 | Heil et al. .................. 395/325 |
| 5,409,547 A | | 4/1995 | Watanabe et al. .......... 136/204 |
| 5,415,699 A | | 5/1995 | Harman ..................... 138/238 |
| 5,432,823 A | | 7/1995 | Gasbarro et al. .......... 375/356 |
| 5,438,224 A | * | 8/1995 | Papageorge et al. ....... 257/777 |
| 5,468,681 A | | 11/1995 | Pasch ........................ 437/183 |
| 5,532,506 A | | 7/1996 | Tserng ....................... 257/276 |
| 5,567,654 A | | 10/1996 | Beilstein, Jr. et al. ...... 437/209 |
| 5,574,923 A | * | 11/1996 | Heeb et al. ................. 395/800 |
| 5,587,119 A | | 12/1996 | White ........................ 264/104 |
| 5,598,031 A | | 1/1997 | Groove et al. ............. 257/668 |
| 5,598,039 A | | 1/1997 | Weber ......................... 307/38 |
| 5,610,366 A | | 3/1997 | Fleurial et al. ............. 136/202 |
| 5,618,752 A | | 4/1997 | Gaul ........................... 438/626 |
| 5,622,875 A | | 4/1997 | Lawrence ................... 438/691 |
| 5,633,962 A | | 5/1997 | Kurata ........................ 385/24 |
| 5,637,828 A | | 6/1997 | Russell et al. ............. 174/52.2 |
| 5,646,067 A | | 7/1997 | Gaul ........................... 437/180 |
| 5,656,548 A | | 8/1997 | Zavracky et al. ............ 438/23 |
| 5,657,481 A | | 8/1997 | Farmwald et al. .......... 395/551 |
| 5,682,062 A | | 10/1997 | Gaul ........................... 257/686 |
| 5,692,558 A | | 12/1997 | Hamilton et al. .......... 165/80.4 |
| 5,699,291 A | | 12/1997 | Tsunemine ................. 365/149 |
| 5,753,529 A | | 5/1998 | Chang et al. ................ 437/67 |
| 5,767,001 A | | 6/1998 | Bertagnolli et al. ........ 438/455 |
| 5,786,628 A | | 7/1998 | Beilstein, Jr. et al. ...... 257/684 |
| 5,807,783 A | | 9/1998 | Gaul et al. .................. 438/406 |
| 5,821,624 A | | 10/1998 | Pasch ........................ 257/776 |
| 5,834,799 A | | 11/1998 | Rostoker et al. ............ 257/98 |
| 5,855,735 A | | 1/1999 | Takada et al. ............ 156/636.1 |
| 5,861,666 A | * | 1/1999 | Bellaar ....................... 257/686 |
| 5,901,050 A | | 5/1999 | Imai ........................... 361/820 |
| 5,902,118 A | | 5/1999 | Hubner ....................... 438/106 |
| 5,903,018 A | | 5/1999 | Shimawaki ................. 257/198 |
| 5,903,045 A | | 5/1999 | Bertin et al. ................ 257/621 |
| 5,915,167 A | | 6/1999 | Leedy ......................... 438/108 |
| 5,990,564 A | * | 11/1999 | Degani et al. .............. 257/778 |
| 5,991,161 A | * | 11/1999 | Samaras et al. ............ 361/760 |
| 6,016,256 A | | 1/2000 | Crane, Jr. et al. .......... 361/813 |
| 6,137,164 A | | 10/2000 | Yew et al. ..................... 712/33 |
| 6,219,237 B1 | | 4/2001 | Geusic et al. .............. 361/699 |
| 6,223,273 B1 | | 4/2001 | Kanekawa et al. ......... 257/686 |
| 6,281,042 B1 | * | 8/2001 | Ahn et al. .................. 438/108 |

OTHER PUBLICATIONS

Crisp, R., "Development of Single–Chip Multi–GB/s DRAMs", *Digest of International Solid–State Circuits Conference*, 226–227, (1997).

Crisp, R., "Rambus Technology, the Enabler", *Conference Record of WESCON*, Anaheim, CA, 160–165, (Nov. 17–19, 1992).

Demmin, J., "nCHIP's Silicon Circuit Board Technology", *National Electronic Packaging and Production Conference, NEPCON West 94, 3*, Proceedings of the Technical Program, 2038–9, (1993).

Donnelly, K.S., et al., "A 660MB/s Interface Megacell Portable Circuit in −.3 mum–0.7 mum CMOS ASIC ", *IEEE Journal of Solid–State Circuits, vol. 32*, 1995–2003, (Dec. 1996).

Feinberg, I., et al., "Interposer for Chip–on–Chip Module Attachment", *IBM Technical Disclosure Bulletin, 26(9)*, 4590–91, (Feb. 1984).

Foster, R., et al., "High Rate Low–Temperature Selective Tungsten", *In: Tungsten and Other Refractory Metals for VLSI Applications III*, V.A. Wells, ed., Materials Res. Soc., Pittsburgh, PA, 69–72, (1988).

Goodman, T., et al., "The Flip Chip Market", *Advanced Packaging*, 24–25, (Sep./Oct. 1997).

Gray, P.R., et al., "Analysis and Design of Analog and Integrated Circuits", *John Wiley and Sons, 2nd ed.*, 617–622, (1984).

Heremans, P., et al., "Optoelectronic Integrated Receiver for Inter–MCM and Inter–Chip Optical Interconnects", *Technical Digest, International Electron Devices Meeting*, 657–660, (Dec. 1996).

Horie, H., et al., "Novel High Aspect Ratio Aluminum Plug for Logic/DRAM LSI's Using Polysilicon–Aluminum Substitute", *Technical Digest: IEEE International Electron Devices Meeting*, San Francisco, CA, 946–948, (1996).

Horowitz, M., et al., "PLL Design for a 500mbs Interface", *Dig. International Solid–State Circuits Conference*, 160–161, (1993).

Huth, N., "Next–Generation Memories", *Electronik, 42(23)*, 36–44, (1993).

Krishnamoorthy, A.V., et al., "Ring Oscillators with Optical and Electrical Readout Based on Hybrid GaAs MQW Modulators Bonded to 0.8 Micron Silicon VLSI Cricuits", *Electronics Lett. 31(22)*, 1917–18, (Oct. 26, 1995).

Lee, T.H., et al., "A 2.5V Delay–Locked Loop for an 18Mb 500MB/s DRAM", *Digest of International Solid–State Circuits Conference*, 300–301, (1994).

Lehmann, V., "The Physics of Macropore Formation in Low Doped n–Type Silicon", *Journal of the Electrochemical Society, 140(10)*, 2836–2843, (Oct. 1993).

Lin, C.M., et al., "Precision Embedded Thin Film Resistors for Multichip Modules (MCM–D)", *Proceedings IEEE Multichip Module Conference*, 44–9, (1997).

Mimura, T., et al., "System Module: a New Chip–on–Chip Module Technology", *Proceedings of 1997 IEEE Custom Integrated Circuit Conference*, 439–442, (1997).

Muller, K., et al., "Trench Storage Node Technology for Gigabit DRAM Generations", *Digest IEEE International Electron Devices Meeting*, San Francisco, CA, 507–510, (Dec. 1996).

Ohba, T., et al., "Evaluation on Selective Deposition of CVD W Films by Measurement of Surface Temperature", *In: Tungsten and Other Refractory Metals for VLSI Applications II*, Materials Research Society, Pittsburgh, PA, 59–66, (1987).

Ohba, T., et al., "Selective Chemical Vapor Deposition of Tungsten Using Silane and Polysilane Reductions", *In: Tungsten and Other Refractory Metals for VLSI Applications IV*, Materials Research Society, Pittsburgh, PA, 17–25, (1989).

Patel, N.G., et al., "Thermolectric Cooling Effect in a p–Sb2Te3/n–Bi2Te3 Thin Film Thermocouple", *Solid–State Electronics 35(9)*, 1269–72, (1992).

Ramo, S., et al., *Fields and Waves in Communication Electronics, Third Edition*, John Wiley & Sons, Inc., pp. 428–433, (1994).

Rucker, T.G., et al., "A High Performance SI on SI Multichip Module Technology", *1992 Symposium on VLSI Technology. Digest of Technical Papers, IEEE*, Japanese Society of Applied Physics, 1992 Seattle, WA, 72–73, (Jun. 2–4 1992).

Sekine, et al., "A New High–Density Plasma Etching System Using a Dipole–Ring Magnet", *Jpn. J. Appl. Phys., Pt. 1, No. 11*, 6274–6278, (Nov. 1995).

Seraphim, D.P., et al., "Principles of Electronic Packaging.", *In: Principles of Electronic Packaging*, McGraw–Hill, New York, NY, 44, 190, 595–597, (1989).

Shafai, C., et al., "A Micro–Integrated Peltier Heat Pump for Localized On–chip Temperature Control.", *Canadian Journal of Physics, 74, Suppl., No. 1*, S139–142, (1996).

Shafai, C., et al., "Optimization of Bi2Te3 Thin Films for Microintegrated Peltier Heat Pumps", *Journal of Vacuum Science and Technology A, Second Series 15, No. 5*, Preliminary Program, 44th National Symposium of the AVS, San Jose, CA, 2798–2801, (Sep./Oct. 1997).

Su, D.K., et al., "Experimental Results and Modeling Techniques for Substrate Noise in Mixed–Signal Integrated Circuits", *IEEE Journal of Solid–State Circuits, 28(4)*, 420–430, (Apr. 1993).

Vardaman, E.J., et al., "CSPs: Hot new packages for cool portable products", *Solid State Technology, 40(10)*, 84–89, (Oct. 1997).

Vendier, O., et al., "A 155 Mbps Digital Transmitter Using GaAs Thin Film LEDs Bonded to Silicon Driver Circuits", *Digest IEEE/LEOS 1996 Summer Topical Meetings*, Advanced Applications of Lasers in Materials and Processing, 15–16, (1996).

Vusirikala, V., et al., "Flip–chip Optical Fiber Attachment to a Monolithic Optical Receiver Chip", *SPIE Proceedings (The International Society for Optical Engineering), 2613*, 52–58, (Oct. 24, 1995).

* cited by examiner

STRUCTURE AND METHOD FOR A HIGH-PERFORMANCE ELECTRONIC PACKAGING ASSEMBLY

This application is a division of U.S. patent application Ser. No. 09/144,290, filed on Aug. 31, 1998, now U.S. Pat. No. 6,281,042, the specification of which is incorporated herein by reference.

FIELD OF THE INVENTION

The present invention relates generally to semiconductor integrated circuits. More particularly, it pertains to a structure and method for a high performance electronic packaging assembly.

BACKGROUND OF THE INVENTION

Integrated circuit technology relies on transistors to formulate vast arrays of functional circuits. The complexity of these circuits requires the use of an ever increasing number of linked transistors. As the number of transistors required increases, the integrated circuitry dimensions shrink. One challenge in the semiconductor industry is to develop improved methods for electrically connecting and packaging circuit devices which are fabricated on the same and on different wafers or chips. It is an objective in the semiconductor industry to construct transistors which occupy less surface area on the silicon chip/die.

As integrated circuit technology progresses there is a growing desire for a "system on a chip." Ideally, a computing system would be fabricated with all the necessary integrated circuits on one wafer, as compared with today's method of fabricating many chips of different functions and packaging them to assemble a complete system. Such a structure would greatly improve integrated circuit performance and provide higher bandwidth. In practice, it is very difficult with today's technology to implement a truly high-performance "system on a chip" because of vastly different fabrication processes and different manufacturing yields for the logic and memory circuits. Thus, what is needed is an improved method and structure which continues to approach the ideal set-up of a "system on a chip" and thus improves the integration of different chips in an integrated circuit.

For the reasons stated above, and for other reasons stated below which will become apparent to those skilled in the art upon reading and understanding the present specification, it is desirable to develop a structure and method to increase the operational speeds, or data bandwidth, between different circuit devices, e.g. logic and memory chips. It is further desirable to attain this ability using current CMOS fabrication techniques.

SUMMARY OF THE INVENTION

The above mentioned problems with integrated circuits and other problems are addressed by the present invention and will be understood by reading and studying the following specification. A structure and method are provided to maximize the bandwith between different circuit devices.

In particular, an illustrative embodiment of the present invention includes an electronic packaging assembly. The electronic packaging assembly includes a silicon interposer which has a first and second side. At least one semiconductor chip is located on a first side of the silicon interposer. At least one semiconductor chip is located on a second side of the silicon interposer. A number of electrical connections exist through the silicon interposer which couple the semiconductor chips located on each side of the silicon interposer.

In another embodiment, an electronic system module is provided. The electronic system module includes a silicon interposer which has opposing surfaces. A microprocessor is included which has a circuit side. The circuit side of the microprocessor faces a first one of the opposing surfaces of the silicon interposer. A first memory chip is included which has a circuit side. The circuit side of the memory chip faces a second one of the opposing surfaces of the silicon interposer. Further, a number of electrical connections are provided which extend through the silicon interposer. The number of electrical connections couple the circuit side of the microprocessor to the circuit side of the first memory chip.

In another embodiment, a computer system is provided. The computer system includes an electronic packaging assembly. The electronic packaging assembly includes the electronic packaging assembly presented and described above. A number of external devices are included. A system bus couples the electronic packaging assembly to the number of external devices.

In another embodiment, a method for forming integrated circuits is provided. The method includes providing a silicon interposer which has opposing sides. A first semiconductor chip is coupled to a first side of the silicon interposer. A second semiconductor chip is coupled to a second side of the silicon interposer. The method further includes coupling the first semiconductor chip to the second semiconductor chip by means of electrical connections through the silicon interposer.

In an alternative embodiment, a method for forming integrated circuit is provided. The method includes providing a silicon interposer which has opposing sides. A number of micro-machined vias are formed through the silicon interposer. The micro-machined vias include a number of electrical connections between the opposing surfaces of the silicon interposer. A logic chip is coupled to the number of micro-machined vias on a first side of the silicon interposer. The method further includes coupling a memory chip to the number of micro-machined vias on a second side of the silicon interposer.

Thus, an improved structure and method are provided. The structure and method increase the operational bandwidth between different circuit devices, e.g. logic and memory chips, without requiring changes in current CMOS processing techniques. The structure includes the use of a silicon interposer. The silicon interposer can consist of recycled rejected wafers from the front-end semiconductor processing. This provides the added advantage of low cost and availability. A silicon interposer is thermally matched to the circuit devices such that coefficient of expansion mismatches are nonexistent. And, deposition of conductors on the silicon interposer's surface is readily accomplished using a standard integrated circuit multi-layer metallurgy.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction. perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n−" and "p−" refer to lightly doped n and p-type semiconductor materials, respectively.

Figure 1:
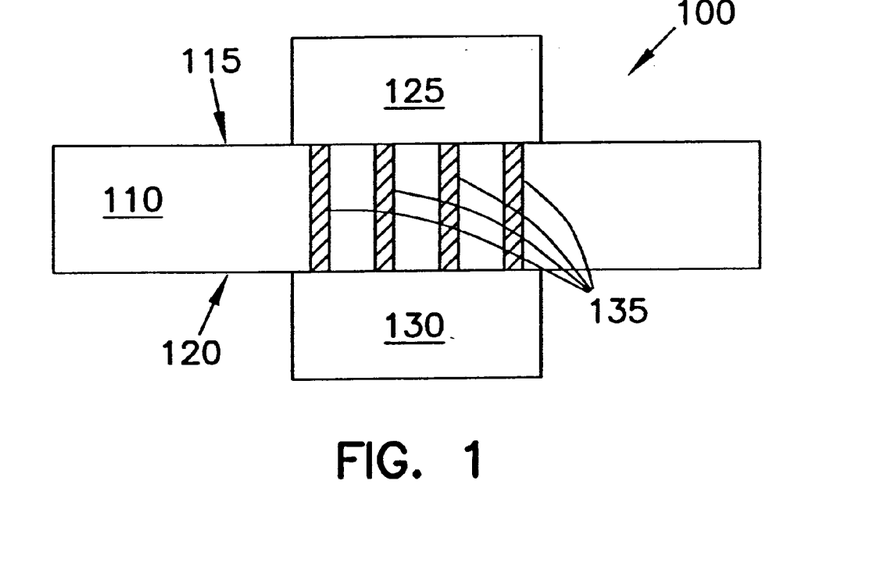
FIG. 1 is a cross-sectional view illustrating an electronic packaging assembly according to the teachings of the present invention.

FIG. 1 is a cross-sectional view illustrating an electronic packaging assembly 100 according to the teachings of the present invention. According to an alternative embodiment, the electronic packaging assembly 100 can be implemented as an electronic system module. FIG. 1 includes a silicon interposer 110. The silicon interposer 110 has opposing surfaces which include a first one 115 of the opposing surfaces, or first side 115 and a second one 120 of opposing surfaces, or second side 120. In one exemplary embodiment, the silicon interposer 110 includes rejected silicon wafers which have been recycled from the front-end of the semiconductor fabrication process. The assembly 100 includes at least one semiconductor chip 125 on the first side 115 of the silicon interposer 110. In one exemplary embodiment, the at least one semiconductor chip 125 on the first side 115 includes a microprocessor chip. In another embodiment, the at least one semiconductor chip 125 includes any suitable logic chip.

The electronic packaging assembly of FIG. 1 further illustrates at least one semiconductor chip 130 on the second side 120 of the silicon interposer 110. In one exemplary embodiment, the at least one semiconductor chip 130 on the second side 120 of the silicon interposer includes a memory chip. The memory chip can include a dynamic random access memory (DRAM)-type chip. Likewise, the memory chip can include a static random access memory (SRAM)-type chip or flash electrically erasable program read only memory (flash EEPROM) type chip.

FIG. 1 illustrates that the at least one semiconductor chip 125 located on the first side 115 of the silicon interposer 110 is coupled to the at least one semiconductor chip 130 located on the second side 120 of the silicon interposer 110 by a number of electrical connections 135. The number of electrical connections 135 include micro-machined vias. The number of electrical connections 135 may be formed using, for example, the techniques shown and described with respect to FIGS. 1–8 of co-pending application Ser. No. 08/917,443, entitled "Integrated Circuitry and Methods of Forming Integrated Circuitry," filed on Aug. 22, 1997 or with respect to FIGS. 1–13 of Application Ser. No. 08/917,449, entitled "Methods of Forming Coaxial Integrated Circuitry Interconnect Lines, and Integrated Circuitry," filed on Aug. 22, 1997, which applications are incorporated herein by reference.

Figure 2:
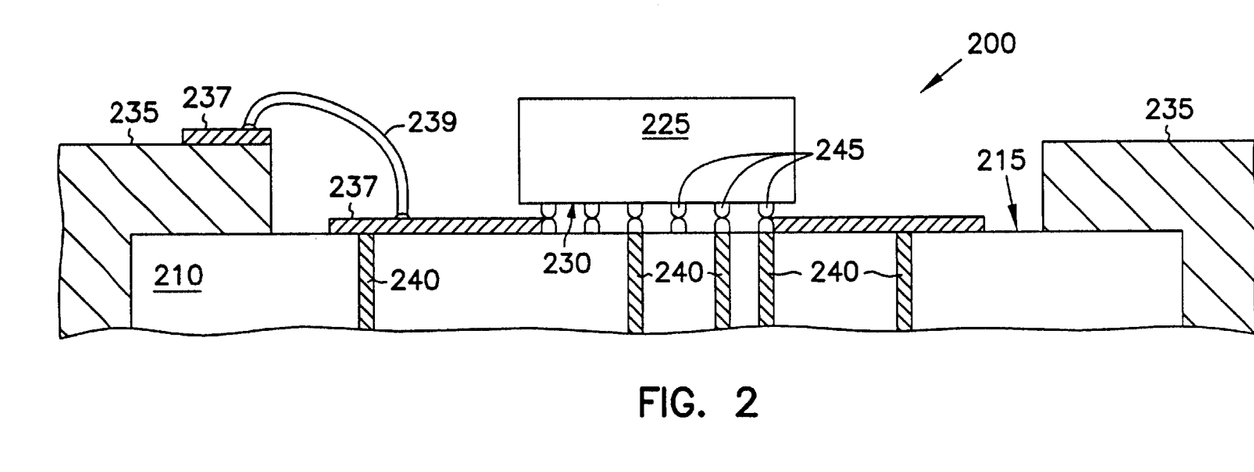
FIG. 2 is a cross-sectional view illustrating in greater detail a portion of a first one of opposing surfaces for the electronic packaging assembly of FIG. 1.

FIG. 2 is a cross-sectional view illustrating in greater detail a portion of an embodiment of an electronic packaging assembly 200. The electronic packaging assembly 200 includes a silicon interposer 210. FIG. 2 illustrates a first one 215 of opposing surfaces of the silicon interposer 210. At least one semiconductor chip 225 is coupled to the first one 215 of opposing sides of the silicon interposer 210. FIG. 2 additionally illustrates illustrates that the silicon interposer 210 includes a number of electrical connections 240 which extend through the silicon interposer 210.

The number of electrical connections 240 include micro-machined vias 240. In one embodiment, the number of electrical connections 240 include micropores which penetrate the silicon interposer 210 and are formed from deposited dielectrics and conductors to form coaxial wiring. In this embodiment, the number of electrical connections 240 may be formed using, for example, the techniques shown or described with respect to FIGS. 1–13 of application Ser. No. 08/917,449, entitled "Methods of Forming Coaxial Integrated Circuitry Interconnect Lines, and Integrated Circuitry," filed on Aug. 22, 1997, which application is incorporated herein by reference. In an alternative embodiment, the number of electrical connections 240 includes salicided connections. In this embodiment, the number of electrical connections 240 may be formed using, for example, the techniques shown and described with respect to FIGS. 1–8 of co-pending application Ser. No. 08/917,443, entitled "Integrated Circuitry and Methods of Forming Integrated Circuitry," filed on Aug. 22, 1997, which application is incorporated by reference.

In one exemplary embodiment, the at least one semiconductor chip 225 includes a microprocessor chip 225. In another embodiment, the at least one semiconductor chip 225 includes any suitable logic chip 225. The microprocessor chip 225 has a circuit side 230. The circuit side 230 of the microprocessor chip 225 faces the first one 215 of the opposing surfaces of the silicon interposer 210. Electrical contacts 245 couple the circuit side 230 of the microprocessor chip 225 to the number of electrical connections 240. In one embodiment, a ball grid array (BGA) 245 couples the circuit side 230 of the microprocessor chip 225 to the number of electrical connections 240. Each ball grid array is encapsulated for passivation and to eliminate electrical contact failures caused by vibration, shock, and thermal cycling. In an alternate embodiment, the circuit side 230 is coupled to the number of electrical connections 240 by any suitable electrical contact 245.

FIG. 2 illustrates that the silicon interposer 210 is further connected to an integrated circuit package 235, or chip package 235. One of ordinary skill in the art of semiconductor fabrication will understand the manner by which the silicon interposer 210 may be connected to the chip package 235. The chip package 235 and the silicon interposer have electrical lead pads 237, or metal connects, 237. FIG. 2 illustrates that the electronic packaging assembly 200 includes electrical coupling 239 between the chip package 235 and the silicon interposer 210. In one embodiment, the electrical coupling 239 includes wire bonding. In an alternative embodiment, the electrical coupling 239 includes any suitable coupling as the same is known and practiced by those of ordinary skill in the field of semiconductor fabrication. Also, according to this structural arrangement, the back side of the microprocessor chip 225 is exposed to cooling air. The back side of the microprocessor chip. 225 can, alternatively or additionally, be contacted by a suitable heat sink to provide heat removal.

Figure 3:
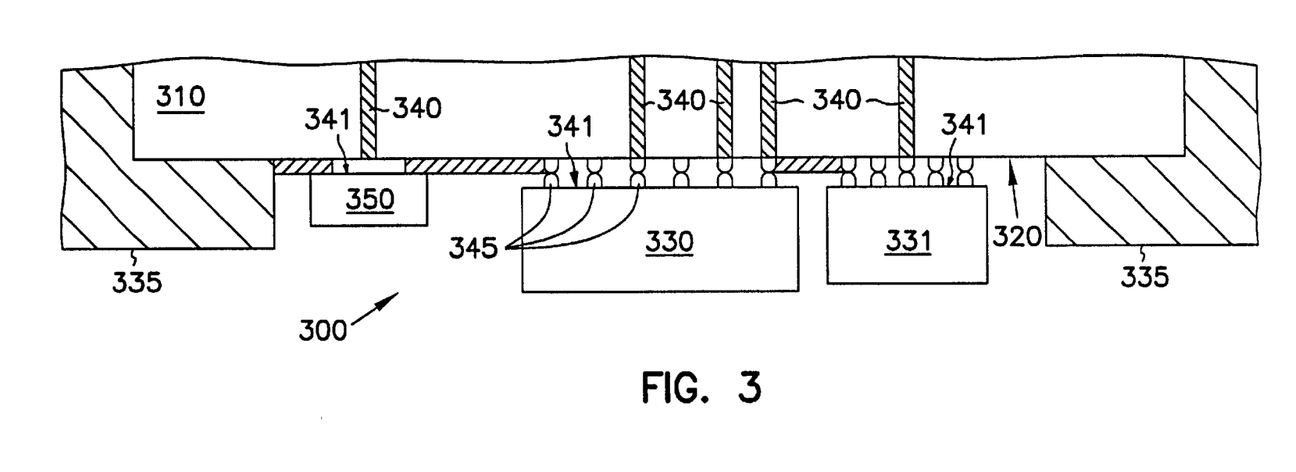
FIG. 3 is a cross-sectional view illustrating in greater detail a portion of a second one of opposing surfaces for the electronic packaging assembly of FIG. 1.

FIG. 3 is a cross-sectional view illustrating in greater detail a portion of an embodiment of an electronic packaging assembly 300. The electronic packaging assembly 300 includes a silicon interposer 310. In FIG. 3, a number of electrical connections 340 extend through the silicon interposer 310. The number of electrical connections 340 include micro-machined vias. In one embodiment, the number of electrical connections 340 include micropores which penetrate the silicon interposer 310 and are formed from deposited dielectrics and conductors to form coaxial wiring. In this embodiment, the number of electrical connections 340 may be formed using, for example, the techniques shown or described with respect to FIGS. 1–13 of application Ser. No. 08/917,449, entitled "Methods of Forming Coaxial Integrated Circuitry Interconnect Lines, and Integrated Circuitry," filed on Aug. 22, 1997, which application is incorporated herein by reference. In an alternative embodiment, the number of electrical connections 340 includes salicided connections. In this embodiment, the number of electrical connections 340 may be formed using, for example, the techniques shown and described with respect to FIGS. 1–8 of co-pending application Ser. No. 08/917,443, entitled "Integrated Circuitry and Methods of Forming Integrated Circuitry," filed on Aug. 22, 1997, which application is incorporated by reference.

In FIG. 3, a second one 320 of opposing surfaces of the silicon interposer 310 is shown. At least one semiconductor chip 330 is coupled to the second side 320 of the silicon interposer 310. In one exemplary embodiment, the at least one semiconductor chip 330 on the second side 320 of the silicon interposer 310 includes a memory chip 330. The memory chip 330 can include a dynamic random access memory (DRAM)-type chip. Likewise, the memory chip 330 can include a static random access memory (SRAM)-type chip or a flash EEPROM type chip.

FIG. 3 illustrates that the electronic packaging assembly 300 can include a second semiconductor chip 331 on the second side 320 of the silicon interposer 310. In one exemplary embodiment, the second semiconductor chip 331 includes a second memory chip 331. Like before, the second memory chip 331 can include a dynamic random access memory (DRAM)-type chip. And, the second memory chip 331 can include a static random access memory (SRAM)-type chip or a flash EEPROM type chip. FIG. 3 additionally illustrates that the electronic packaging assembly 300 can include a capacitor 350 on the second side 320 of the silicon interposer 310.

The memory chip 330, the second memory chip 331, and the capacitor 350 each have a circuit side 341. The circuit side 341 of each faces the second one 320 of the opposing surfaces of the silicon interposer 310. Electrical contacts 345 couple each circuit side 341 of the memory chip 330, the second memory chip 331, and the capacitor 350 to the number of electrical connections 340. In one embodiment, a ball grid array (BGA) 345 is used to couple each circuit side 341 of the memory chip 330, the second memory chip 331, and the capacitor 350 to the number of electrical connections 340. Each ball grid array is encapsulated for passivation and to eliminate electrical contact failures caused by vibration, shock, and thermal cycling. In an alternate embodiment, each circuit side 341 is coupled to the number of electrical connections 340 by any suitable electrical contact 345.

As shown in FIG. 3, silicon interposer 310 is connected to a chip package 335. One of ordinary skill in the art of semiconductor fabrication will understand the manner by which the silicon interposer 310 may be connected to the chip package 335.

Figure 4:
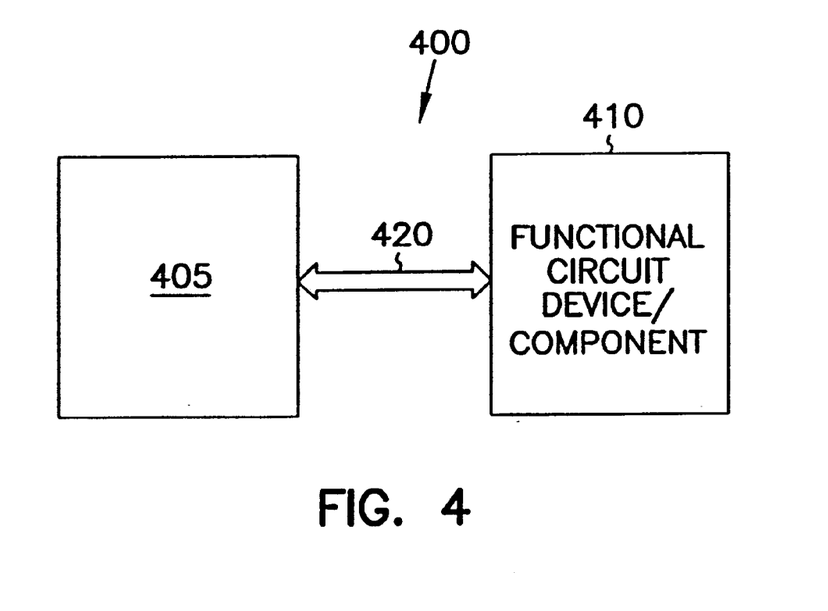
FIG. 4 is a block diagram illustrating a computer system according to an embodiment of the present invention.

FIG. 4 is a block diagram illustrating a computer system 400 according to an embodiment of the present invention. The computer system 400 includes an electronic packaging system 405. The electronic packaging system 405 includes the electronic packaging system 405 presented and described in detail above. The computer system 400 includes a number of external devices 410. The number of external devices 410 include, for example, memory controllers, microprocessors and input/output bus units. The computer system 400 includes a system bus 420. The system bus 420 couples the number of external devices 410 to the electronic packaging system 405.

Figure 5:
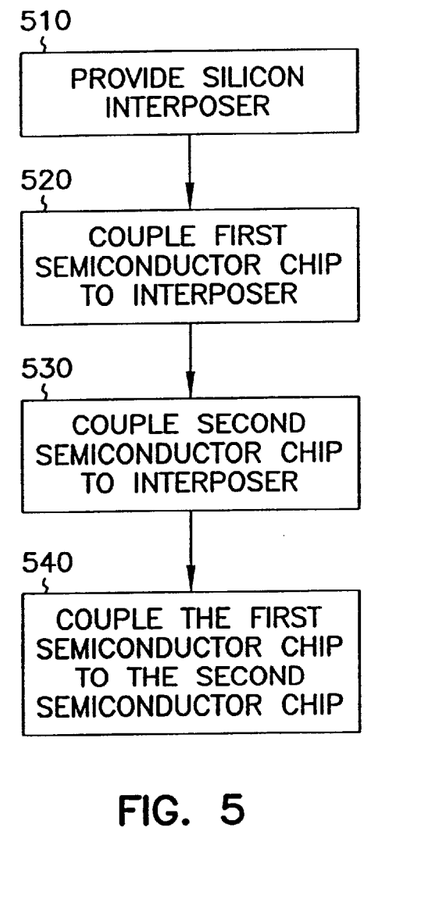
FIG. 5 illustrates, in flow diagram form, a methodical aspect according to the teachings of the present invention.

FIG. 5 illustrates, in flow diagram form, a methodical aspect according to the teachings of the present invention. A silicon interposer is provided at 510. A first semiconductor chip is coupled to the silicon interposer at 520. Next, a second semiconductor chip is coupled to the silicon interposer at 530. The first and second semiconductor chips are coupled to each other at 540, preferably in a manner described above.

Figure 6:
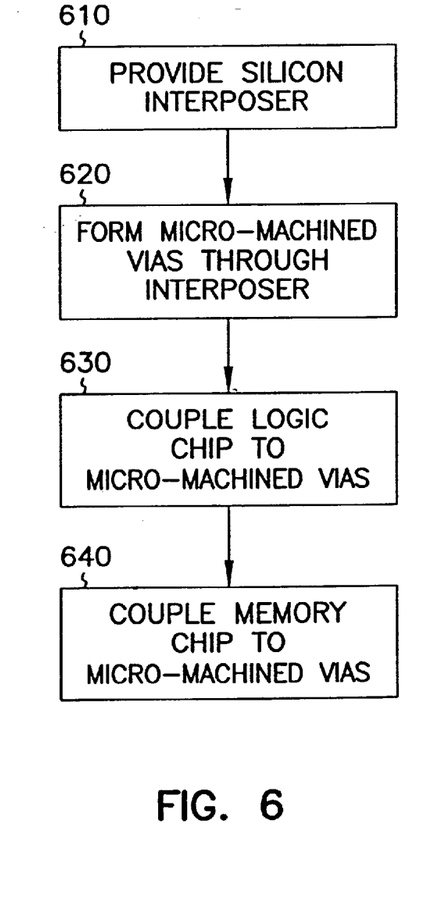
FIG. 6 illustrates, in flow diagram form, another methodical aspect according to the teachings of the present invention.

FIG. 6 illustrates, in flow diagram form, another methodical aspect according to the teachings of the present invention. A silicon interposer is provided at 610. Micro-machined vias are formed through the silicon interposer at 620, preferably in a manner described above. A first semiconductor chip is coupled to the micro-machined vias at 620.

And, a second semiconductor chip is coupled to the micromachined vias at 640.

Conclusion

An improved structure and method for integrating different chips in a integrated circuit is provided. The structure and method increase the operational bandwidth between different circuit devices, e.g. logic and memory chips, without requiring changes in current CMOS processing techniques. The structure includes the use of a silicon interposer. The silicon interposer can consist of recycled rejected wafers from the front-end semiconductor processing. This provides the added advantage of low cost and availability. A silicon interposer is thermally matched to the package circuits components such that coefficient of expansion mismatches are nonexistent. And, deposition of conductors on the silicon interposer's surface is readily accomplished using a standard integrated circuit multi-layer metallurgy.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An electronic packaging assembly, comprising:
    a silicon interposer having first and second sides;
    at least one semiconductor chip on a first side of the silicon interposer;
    at least one semiconductor chip on a second side of the silicon interposer; and
    a number of electrical connections through the silicon interposer wherein the number of electrical connections couple the semiconductor chips located on each side of the silicon interposer,
    wherein the number of electrical connections include salicided connections.

2. The electronic packaging assembly of claim 1, wherein the silicon interposer is formed from recycled silicon wafers.

3. The electronic packaging assembly of claim 1, wherein the at least one semiconductor chip on the first side of the silicon interposer includes a microprocessor chip.

4. The electronic packaging assembly of claim 1, wherein the at least one semiconductor chip on the second side of the silicon interposer includes a memory chip.

5. The electronic packaging assembly of claim 4, wherein the memory chip is a DRAM chip.

6. The electronic packaging assembly of claim 4, wherein the memory chip is a SRAM chip.

7. The electronic packaging assembly of claim 4, wherein the memory chip is a flash EEPROM chip.

8. The electronic packaging assembly of claim 1, wherein the number of electrical connections includes a number of micro-machined vias.

9. An electronic system module, comprising:
    a silicon interposer having opposing surfaces;
    a microprocessor, having an circuit side, the circuit side facing a first one of the opposing surfaces of the silicon interposer;
    a first memory chip, having an circuit side, the circuit side facing a second one of the opposing surfaces of the silicon interposer; and
    a number of electrical connections extending through the silicon interposer, the number of electrical connections coupling the circuit side of the microprocessor to the circuit side of the first memory chip,
    wherein the number of electrical connections include salicided connections.

10. The electronic system module of claim 9, wherein a ball grid array (BGA) couples the circuit sides of the microprocessor or the memory chip to the opposing surfaces of the silicon interposer.

11. The electronic system module of claim 10, wherein each ball grid array (BGA) is encapsulated for passivation to eliminate failures.

12. The electronic system module of claim 9, wherein the number of electrical connections includes a number of micro-machined vias.

13. The electronic system module of claim 9, wherein the number of electrical connections include micropores, and wherein the micropores include holes adapted for depositing dielectrics and conductors to form coaxial wiring.

14. The electronic system module of claim 9, the module further including a second memory chip, the second memory chip having an circuit side, the circuit side facing the second one of the opposing surfaces of the silicon interposer, and the circuit side coupling to the number of electrical connections.

15. The electronic system module of claim 9, the module further including at least one capacitor.

16. The electronic system module of claim 15, wherein the capacitor is coupled to the second one of the opposing surfaces of the silicon interposer.

17. The electronic system module of claim 9, wherein the silicon interposer is formed from recycled silicon wafers.

18. The electronic system module of claim 9, wherein at least one of the opposing surfaces is exposed to a cooling mechanism.

19. The electronic system module of claim 9, wherein the electronic system module includes wire bonding on the first or second opposing surface in order to couple the microprocessor or memory to a number of electrical lead pads on an integrated circuit package.

20. The electronic system module of claim 9, wherein the electronic system module includes tape automated bonding (TAB) on the first or second opposing surface in order to couple the microprocessor or memory to a number of electrical lead pads on an integrated circuit package.

21. An electronic system, comprising:
    an electronic packaging assembly, the electronic packaging assembly including:
        a silicon interposer having first and second sides;
        at least one semiconductor chip on a first side of the silicon interposer;
        at least one semiconductor chip on a second side of the silicon interposer; and
        a number of electrical connections through the interposer,
        wherein the number of connections couple the semiconductor chips located on each side of the silicon interposer, and wherein the number of electrical connections include salicided connections;
a number of external devices; and
a system bus, wherein the system bus couples the electronic packaging assembly to the number of external devices.

22. The electronic system of claim 21, wherein the silicon interposer is formed from recycled silicon wafers.

23. The electronic system of claim 21, wherein the at least one semiconductor chip on the first side of the silicon interposer includes a microprocessor chip.

24. The electronic system of claim 21, wherein the at least one semiconductor chip on the second side of the silicon interposer includes a memory chip.

25. The electronic system of claim 21, wherein the number of electrical connections includes a number of micro-machined vias.

26. A module, comprising:
a silicon interposer having opposing surfaces;
a chip package electrically coupled to the silicon interposer;
a first microprocessor having a circuit side that faces a first one of the opposing surfaces of the silicon interposer;
a first memory chip having a circuit side that faces a second one of the opposing surfaces of the silicon interposer;
second memory chip having a circuit side that faces the second one of the opposing surfaces of the silicon interposer; and
a number of electrical connections extending through the silicon interposer, the number of electrical connections coupling the circuit side of the first microprocessor to the circuit side of each of the first and second memory chips,
wherein the number of electrical connections each include a conductive material and a non-conductive material, and
wherein the non-conductive material includes a dielectric material.

27. The module of claim 26, wherein the module further comprises a second microprocessor having a circuit side that faces the first one of the opposing surfaces of the silicon interposer, and wherein the number of electrical connections couple the circuit side of the second microprocessor to the circuit side of the first and second memory chips.

28. A system, comprising:
a packaging assembly, the packaging assembly including:
a silicon interposer having first and second opposing sides;
a first microprocessor chip on the first side of the silicon interposer;
a number of memory chips on the second side of the silicon interposer; and
a number of electrical connections through the silicon interposer;
a number of external devices; and
a system bus,
wherein the number of electrical connections in the packaging assembly couple the first microprocessor chip to the memory chips,
wherein the number of electrical connections each include a conductive material and a non-conductive material,
wherein the non-conductive material includes a dielectric material, and
wherein the system bus couples the packaging assembly to the number of external devices.

29. The system of claim 28, wherein the packaging assembly further includes a second microprocessor chip on the first side of the silicon interposer, and wherein the number of electrical connections couple the second microprocessor chip to the memory chips.

30. A packaging assembly, comprising:
a silicon interposer having first and second opposing sides;
at least one semiconductor chip on the first side of the silicon interposer;
at least one semiconductor chip on the second side of the silicon interposer; and
a number of electrical connections through the silicon interposer,
wherein the number of electrical connections couple the semiconductor chips located on each side of the silicon interposer, and
wherein the number of electrical connections include micropores having holes, and
wherein the holes include coaxial wiring having both a conductive material and a non-conductive dielectric material.

31. The packaging assembly of claim 30, wherein the at least one semiconductor chip on the first side of the silicon interposer includes a microprocessor chip.

32. The packaging assembly of claim 30, wherein the at least one semiconductor chip on the second side of the silicon interposer includes a memory chip.

33. A packaging assembly, comprising:
a silicon interposer having first and second opposing sides;
at least one semiconductor chip on the first side of the silicon interposer;
at least one semiconductor chip on the second side of the silicon interposer; and
a number of electrical connections through the silicon interposer,
wherein the number of electrical connections couple the semiconductor chips located on each side of the silicon interposer,
wherein the number of electrical connections include a number of micro-machined vias,
wherein the number of micro-machined vias include a conductive material and a non-conductive material, and
wherein the non-conductive material in the number of micro-machined vias includes a dielectric material.

34. The packaging assembly of claim 33, wherein the at least one semiconductor chip on the first side of the silicon interposer includes a microprocessor chip.

35. The packaging assembly of claim 33, wherein the at least one semiconductor chip on the second side of the silicon interposer includes a memory chip.

36. The packaging assembly of claim 33, wherein the packaging assembly includes a first and second semiconductor chip on the second side of the silicon interposer, and wherein the number of electrical connections couple the at least one semiconductor chip on the first side of the silicon interposer to the first and second semiconductor chips on the second side of the silicon interposer.

37. An electronic system, comprising:
an electronic packaging assembly, the electronic packaging assembly including:

a silicon interposer having first and second opposing sides;
at least one semiconductor chip on a first side of the silicon interposer;
at least one semiconductor chip on a second side of the silicon interposer; and
a number of electrical connections through the interposer;

a number of external devices; and a system bus, wherein the number of connections of the electronic packaging assembly couple the semiconductor chips located on each side of the silicon interposer, wherein the number of electrical connections include a number of micro-machined vias, wherein the number of micro-machined vias include a conductive material and a nonconductive material, wherein the system bus couples the electronic packaging assembly to the number of external devices, and wherein the non-conductive material in the number of micro-machined vias includes a dielectric material.

38. The electronic system of claim 37, wherein the at least one semiconductor chip on the first side of the silicon interposer includes a microprocessor chip.

39. The electronic system of claim 37, wherein the at least one semiconductor chip on the second side of the silicon interposer includes a memory chip.

* * * * *

UNITED STATES PATENT AND TRADEMARK OFFICE
CERTIFICATE OF CORRECTION

PATENT NO. : 6,570,248 B1
DATED : May 27, 2003
INVENTOR(S) : Ahn et al.

It is certified that error appears in the above-identified patent and that said Letters Patent is hereby corrected as shown below:

<u>Title page,</u>
Item [56], References Cited, U.S. PATENT DOCUMENTS, delete "3/1987" after "4,653,025 A" and insert -- 2/1987 -- therefor; and delete "Morikawa" and insert -- Lin --, therefor.

<u>Column 3,</u>
Line 52, delete "." after "direction".

<u>Column 4,</u>
Line 50, delete "illustrates" after "additionally".

<u>Column 5,</u>
Line 38, delete "." after "chip".

<u>Column 9,</u>
Line 29, insert -- a -- before "second".

Signed and Sealed this

Ninth Day of March, 2004

JON W. DUDAS
*Acting Director of the United States Patent and Trademark Office*